(12) United States Patent
Tarui et al.

(10) Patent No.: US 7,079,060 B2
(45) Date of Patent: Jul. 18, 2006

(54) TEST CIRCUIT FOR EVALUATING CHARACTERISTIC OF ANALOG SIGNAL OF DEVICE

(75) Inventors: Toshiaki Tarui, Hyogo (JP); Masaru Sugimoto, Hyogo (JP); Hisaya Mori, Hyogo (JP); Teruhiko Funakura, Hyogo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/048,723

(22) Filed: Feb. 3, 2005

(65) Prior Publication Data

US 2005/0179576 A1   Aug. 18, 2005

(30) Foreign Application Priority Data

Feb. 12, 2004   (JP) .............................. 2004-034549

(51) Int. Cl.
*H03M 1/12* (2006.01)
(52) U.S. Cl. ........................................ 341/120; 702/69
(58) Field of Classification Search ................ 341/120; 702/66–79, 124–126
See application file for complete search history.

(56) References Cited

U.S. PATENT DOCUMENTS 4,908,621 A * 3/1990 Polonio et al. ............. 341/120
5,352,976 A * 10/1994 Walker et al. ................ 702/67
5,854,598 A * 12/1998 De Vries et al. ............. 341/120
6,956,422 B1 * 10/2005 Reilly et al. .................. 702/79

FOREIGN PATENT DOCUMENTS

| JP | 5-014200 | 1/1993 |
| JP | 5-119064 | 5/1993 |
| JP | 2000-292469 A | 10/2000 |

* cited by examiner

*Primary Examiner*—Howard L. Williams
(74) *Attorney, Agent, or Firm*—McDermott Will & Emery LLP (57) ABSTRACT

In a test circuit, a determination circuit conducts a function test to determine whether timing of a slope section of waveform of an analog signal ANS of a measurement target device is within a range of specifications. An ADC performs AD-conversion only when a potential of analog signal ANS is within a range between reference potentials VOL, VOH. An analysis unit analyzes digital data from the ADC, and conducts a sloping waveform test to evaluate a sloping state of the waveform of analog signal ANS. Therefore, the slope section of the waveform of analog signal ANS of the device can be subjected to AD-conversion in a voltage range divided in arbitrary number of sections within a range of arbitrary voltage amplitude without requiring a large-capacity storage circuit. The function test by a determination circuit and the sloping waveform test by the analysis unit can be performed in parallel.

9 Claims, 11 Drawing Sheets

TEST CIRCUIT FOR EVALUATING CHARACTERISTIC OF ANALOG SIGNAL OF DEVICE

BACKGROUND OF THE INVENTION

1. Field of the Invention

The present invention relates to a test circuit, and more particularly to a test circuit for analyzing and evaluating a characteristic of an analog signal of a device.

2. Description of the Background Art

In order to test a semiconductor device including a variety of analog circuits, a test circuit capable of evaluating a characteristic of an analog signal output from a semiconductor device in high speed with high precision has been necessary. Examples of a method of testing a system LSI include BIST (Built-In Self-Test) in which a test circuit is embedded within a chip of a system LSI and BOST (Built-Out Self-Test) in which a circuit for testing an analog signal is provided on a load board of an LSI tester.

In order to evaluate the characteristic of the analog signal of the device in high speed with high precision, however, an expensive AD converter has been necessary. In addition, as data should constantly be taken in for obtaining an arbitrary signal waveform, a storage circuit of a large capacity has been necessary.

Japanese Patent Laying-Open No. 05-119064 discloses a waveform measuring device realizing measurement resolution higher than resolution attained by an employed AD converter, by digitizing an analog input signal (repeated signal) by division of a voltage range and by overwriting digitized data on a display unit.

In addition, Japanese Patent Laying-Open No. 2000-292469 discloses a jitter measuring device measuring jitter contained in a periodic signal in real time.

As described above, a conventional test circuit has required an expensive AD converter in order to evaluate the characteristic of the analog signal of the device in high speed with high precision. Moreover, a storage circuit of a large capacity has been necessary for constantly taking in data.

SUMMARY OF THE INVENTION

From the foregoing, a primary object of the present invention is to provide an inexpensive test circuit having a simplified configuration and attaining excellent performance.

A test circuit according to the present invention includes: a comparator outputting a first signal when a potential of an analog signal of a device is within a predetermined range and outputting a second signal when the potential of the analog signal of the device is out of the predetermined range; a timing generator generating a timing signal constituted of a pulse signal train; a determination circuit operating in synchronization with the timing signal and determining whether an output signal of the comparator matches with predetermined expected value data; a clock generation circuit generating a clock signal; a logic circuit receiving the output signal of the comparator, passing and outputting the clock signal from the clock generation circuit in response to the first signal, and blocking the clock signal from the clock generation circuit in response to the second signal; an analog-digital converter operating in synchronization with an output signal of the logic circuit, converting the analog signal of the device to digital data, and outputting resultant digital data; and an analysis unit analyzing the digital data from the analog-digital converter. The determination circuit conducts a function test to determine whether or not timing of a slope section of a waveform of the analog signal is within a predetermined range. The analysis unit conducts a sloping waveform test to evaluate a sloping state of the waveform of the analog signal. Therefore, the slope section of the waveform of the analog signal of the device can be subjected to AD conversion in a voltage range divided into an arbitrary number of sections within a range of an arbitrary voltage amplitude, without requiring a storage circuit of a large capacity. In addition, the function test and the sloping waveform test can be performed in parallel. In this manner, an inexpensive test circuit having a simplified configuration and attaining excellent performance can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

First Embodiment

Figure 1:
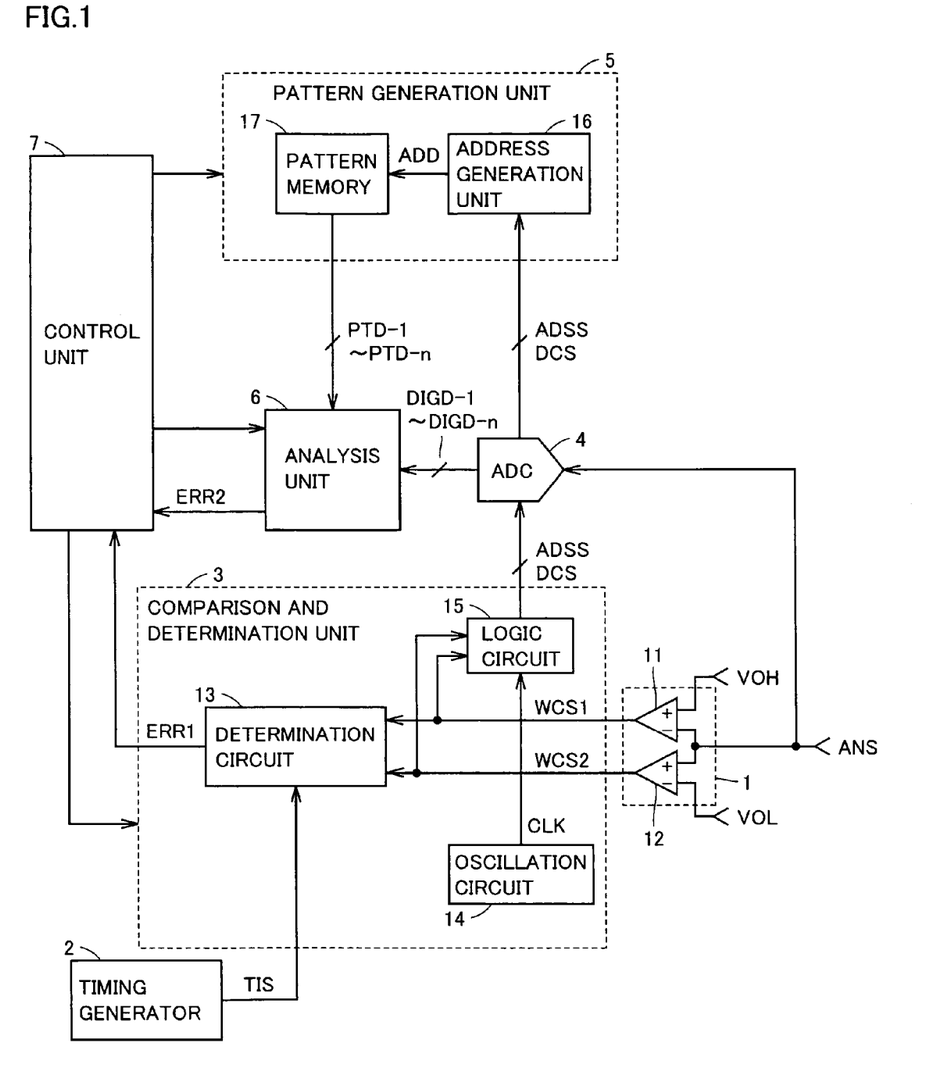
FIG. 1 is a block diagram schematically showing a configuration of a test circuit according to a first embodiment of the present invention.

In FIG. 1, a test circuit includes a window comparator 1, a timing generator 2, a comparison and determination unit 3, an analysis unit 6, an AD converter (hereinafter, referred to as ADC) 4, a pattern generation unit 5, and a control unit 7.

Window comparator 1 includes comparators 11 and 12. Comparison and determination unit 3 includes a determination circuit 13, an oscillation circuit 14, and a logic circuit 15. Pattern generation unit 5 includes an address generation unit 16 and a pattern memory 17.

Comparator 11 compares a potential of analog signal ANS of a measurement target device with a reference potential VOH. When the potential of analog signal ANS is lower than reference potential VOH, comparator 11 sets an output signal WCS1 to "H" level. Meanwhile, when the potential of analog signal ANS is higher than reference potential VOH, comparator 11 sets output signal WCS1 to "L" level. Comparator 12 compares the potential of analog signal ANS of the measurement target device with a reference potential VOL (<VOH). When the potential of analog signal ANS is lower than reference potential VOL, comparator 12 sets an output signal WCS2 to "L" level. Meanwhile, when the potential of analog signal ANS is higher than reference potential VOL, comparator 12 sets output signal WCS2 to "H" level. In this manner, window comparator 1 determines whether or not the potential of analog signal ANS of the measurement target device is within a range from reference potential VOL to reference potential VOH. It is noted that reference potentials VOH and VOL are set to arbitrary values in advance respectively, in accordance with a voltage level of analog signal ANS.

Timing generator 2 generates a timing signal TIS constituted of a pulse signal train. Determination circuit 13 operates in synchronization with timing signal TIS from timing generator 2, and compares expected value data stored in advance with output signals WCS1 and WCS2 of comparators 11 and 12. When a result of comparison indicates that the output signals match with the expected value data, determination circuit 13 sets an output error signal ERR1 to an inactive level. On the other hand, the result of comparison indicates that the output signals do not match with the expected value data, output error signal ERR1 is set to an active level. In this manner, determination circuit 13 conducts a function test to determine whether or not timing of a slope section of the waveform of analog signal ANS is within a range of specifications.

Oscillation circuit 14 generates a clock signal CLK constituted of a pulse signal train having a prescribed cycle. Logic circuit 15 transmits clock signal CLK from oscillation circuit 14 to ADC 4 as an AD conversion start signal ADSS when output signals WCS1 and WCS2 of comparators 11 and 12 both attain "H" level. On the other hand, when at least one of output signals WCS1 and WCS2 of comparators 11 and 12 is set to "L" level, logic circuit 15 does not transmit clock signal CLK from oscillation circuit 14 to ADC 4 while it sets output AD conversion start signal ADSS to "L" level which is the inactive level. In addition, logic circuit 15 generates a discrimination signal DCS for discriminating between a rising section and a falling section of the waveform of analog signal ANS input from the measurement target device. Discrimination signal DCS has its logic level switched in response to output signals WCS1 and WCS2 of comparators 11 and 12 both attaining "H" level. That is, discrimination signal DCS is set to "H" level in the rising section of the waveform of analog signal ANS, while it is set to "L" level in the falling section of the waveform of analog signal ANS.

ADC 4 generates a plurality of pieces of digital data DIGD-1 to DIGD-n (n is an arbitrary natural number) by subjecting analog signal ANS to AD conversion, based on AD conversion start signal ADSS and discrimination signal DCS from logic circuit 15. ADC 4 carries out AD conversion in response to a pulse of AD conversion start signal ADSS. In addition, ADC 4 transmits AD conversion start signal ADSS and discrimination signal DCS from logic circuit 15 to address generation unit 16.

Address generation unit 16 generates an address signal ADD based on AD conversion start signal ADSS and discrimination signal DCS from ADC 4. Address signal ADD has its address switched in response to the pulse of AD conversion start signal ADSS.

Pattern memory 17 outputs a plurality of pieces of expected value pattern data PTD-1 to PTD-n corresponding to addresses indicated by address signal ADD respectively, in response to address signal ADD from address generation unit 16. Expected value pattern data PTD-1 to PTD-n are stored in pattern memory 17 in advance.

Analysis unit 6 analyzes digital data DIGD-1 to DIGD-n from ADC 4. Analysis unit 6 compares digital data DIGD-1 to DIGD-n from ADC 4 with expected value pattern data PTD-1 to PTD-n from pattern memory 17. When respective digital data DIGD-1 to DIGD-n are within a range determined by corresponding expected value pattern data PTD-1 to PTD-n respectively, analysis unit 6 sets an output error signal ERR2 to the inactive level. On the other hand, when respective digital data DIGD-1 to DIGD-n are not within the range determined by corresponding expected value pattern data PTD-1 to PTD-n respectively, analysis unit 6 sets output error signal ERR2 to the active level. In this manner, analysis unit 6 conducts a sloping waveform test to evaluate a sloping state of the waveform of analog signal ANS.

Control unit 7 controls an operation of the test circuit based on error signals ERR1 and ERR2 from comparison and determination unit 3 and analysis unit 6 respectively. For example, when error signal ERR1 is set to the inactive level, control unit 7 operates comparison and determination unit 3. On the other hand, when error signal ERR1 is set to the active level, control unit 7 stops the operation of comparison and determination unit 3. In addition, when error signal ERR2 is set to the inactive level, control unit 7 operates analysis unit 6 and pattern generation unit 5. On the other hand, when error signal ERR2 is set to the active level, control unit 7 stops the operation of analysis unit 6 and pattern generation unit 5.

Figure 2:
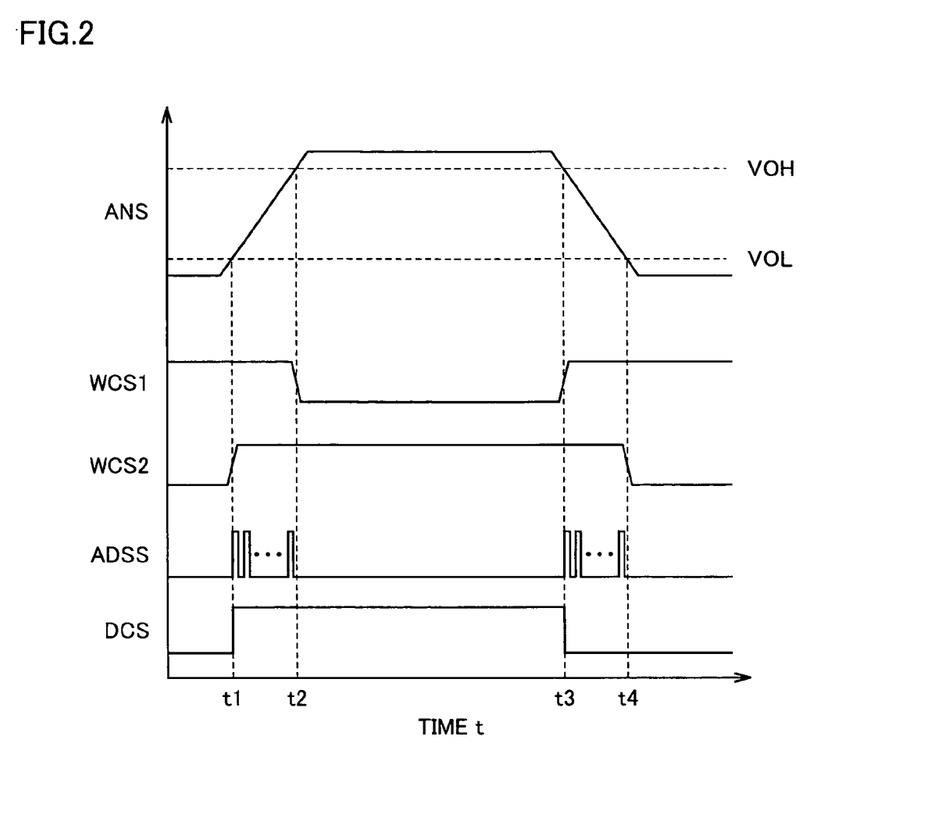
FIG. 2 is a timing chart illustrating an operation of the test circuit shown in FIG. 1.

An operation of the test circuit shown in FIG. 1 will now be described. FIG. 2 is a timing chart illustrating the operation of the test circuit. Referring to FIG. 2, analog signal ANS of the measurement target device is a high-speed analog signal closer to a rectangular wave in shape.

At a time before time t1, comparator 11 sets output signal WCS1 to "H" level, in response to the potential of analog signal ANS set lower than reference potential VOH. Comparator 12 sets output signal WCS2 to "L" level, in response to the potential of analog signal ANS set lower than reference potential VOL. Logic circuit 15 sets output AD conversion start signal ADSS to "L" level which is the inactive level and also sets output discrimination signal DCS to "L" level, in response to at least one of signals WCS1 and WCS2 from comparators 11 and 12 set to "L" level.

At time t1, in response to the potential of analog signal ANS exceeding reference potential VOL, comparator 12 raises output signal WCS2 to "H" level. In response to output signals WCS1 and WCS2 from comparators 11 and 12 both attaining "H" level, logic circuit 15 transmits clock signal CLK from oscillation circuit 14 to ADC4 as AD conversion start signal ADSS, and raises output discrimination signal DCS to "H" level.

At time t2, in response to the potential of analog signal ANS exceeding reference potential VOH, comparator 11 sets output signal WCS1 to "L" level. In response, logic circuit 15 fixes output AD conversion start signal ADSS to "L" level which is the inactive level.

Figure 3:
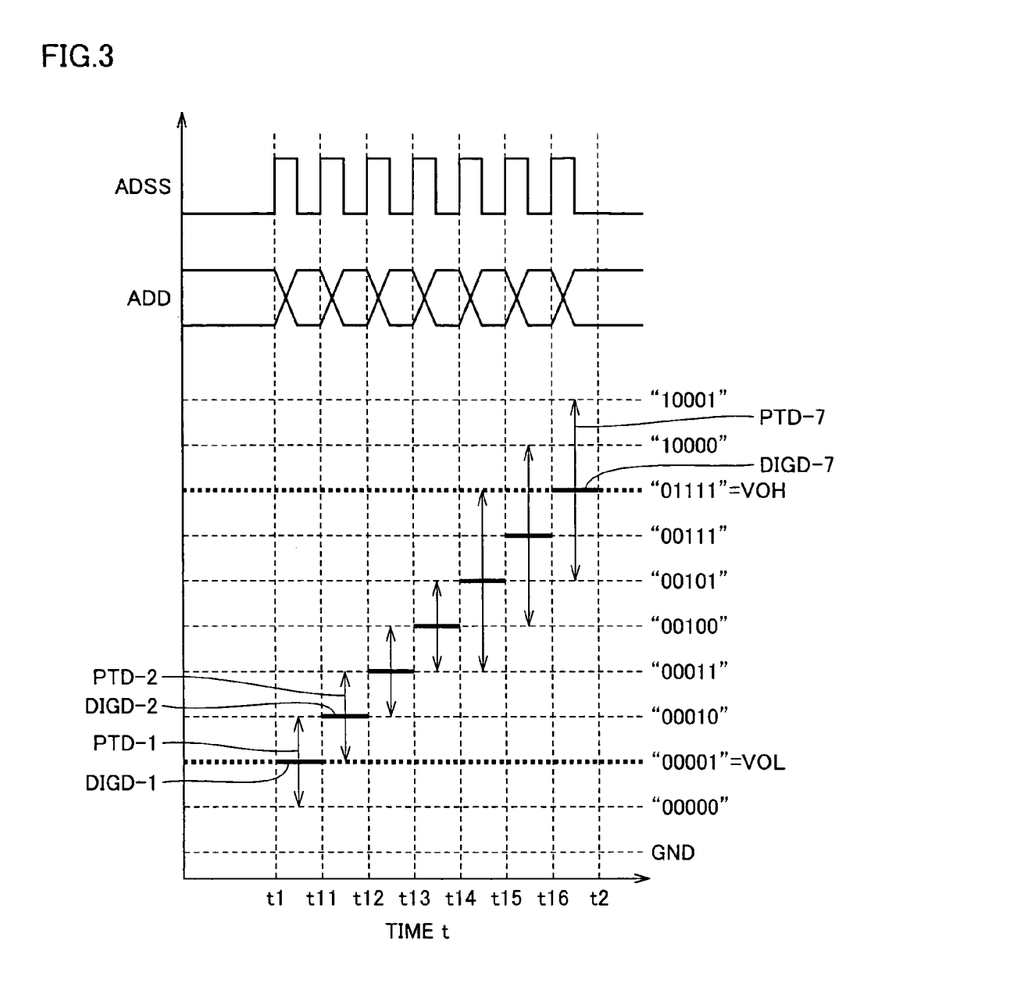
FIG. 3 is a timing chart illustrating the operation of the test circuit during a period from time t1 to time t2 shown in FIG. 2.

FIG. 3 is a timing chart illustrating the operation of the test circuit during a period from time t1 to time t2 shown in FIG. 2. Referring to FIG. 3, ADC 4 generates seven pieces of digital data DIGD-1 to DIGD-7 in synchronization with AD conversion start signal ADSS. Address generation unit 16 switches the address of address signal ADD in response to the pulse of AD conversion start signal ADSS. Pattern generation unit 17 generates seven pieces of expected value pattern data PTD-1 to PTD-7 corresponding to seven pieces of digital data DIGD-1 to DIGD-7 respectively in response to address signal ADD.

At time t1, AD conversion start signal ADSS rises to "H" level. In response, ADC 4 generates digital data DIGD-1 ("00001"=reference potential VOL), and address generation unit 16 switches the address of address signal ADD. Pattern memory 17 generates expected value pattern data PTD-1 ("00000", "00010") corresponding to the address indicated by address signal ADD. Analysis unit 6 sets output error signal ERR2 to the inactive level, in response to digital data DIGD-1 ("00001") being within a range of expected value pattern data PTD-1 ("00000", "00010").

At time t11, AD conversion start signal ADSS again rises to "H" level. In response, ADC 4 generates digital data DIGD-2 ("00010"), and address generation unit 16 switches the address of address signal ADD. Pattern memory 17 generates expected value pattern data PTD-2 ("00001", "00011") corresponding to the address indicated by address signal ADD. Analysis unit 6 sets output error signal ERR2 to the inactive level, in response to digital data DIGD-2 ("00010") being within a range determined by expected value pattern data PTD-2 ("00001", "00011").

Similarly, during a period from time t12 to time t16, digital data DIGD-3 ("00011") to DIGD-7 ("01111"=reference potential VOH) and expected value pattern data PTD-3 ("00010", "00100") to PTD-7 ("00101", "10001") are generated in synchronization with AD conversion start signal ADSS. In addition, analysis unit 6 determines whether respective digital data DIGD-3 ("00011") to DIGD-7 ("01111") are within a range determined by corresponding expected value pattern data PTD-3 ("00010", "00100") to PTD-7 ("00101", "10001") respectively, and outputs error signal ERR2 in accordance with a result of determination.

Though an example in which the voltage range is divided into seven sections ("00001" to "01111") in a range between reference potentials VOL and VOH during a period from time t1 to time t2 has been described, AD conversion can be performed in a voltage range divided into an arbitrary number of sections in a range between arbitrary reference potentials VOL and VOH.

Referring again to FIG. 2, at time t3, in response to the potential of analog signal ANS set lower than reference potential VOH, comparator 11 raises output signal WCS1 to "H" level. Logic circuit 15 transmits clock signal CLK from oscillation circuit 14 to ADC 4 as AD conversion start signal ADSS and lowers discrimination signal DCS to "L" level, in response to output signals WCS1 and WCS2 from comparators 11 and 12 both attaining "H" level.

At time t4, in response to the potential of analog signal ANS set lower than reference potential VOL, comparator 12 sets output signal WCS2 to "L" level. In response, logic circuit 15 sets output AD conversion start signal ADSS to "L" level which is the inactive level.

During a period from time t3 to time t4, similarly to the period from time t1 to time t2, digital data DIGD-1 to DIGD-n and expected value pattern data PTD-1 to PTD-n are generated in synchronization with AD conversion start signal ADSS. In addition, analysis unit 6 determines by comparison whether or not respective digital data DIGD-1 to DIGD-n are within a range of corresponding expected value pattern data PTD-1 to PTD-7 respectively, and outputs error signal ERR2 in accordance with a result of determination.

As described above, according to the first embodiment, AD conversion of analog signal ANS of the measurement target device can be performed in the voltage range divided into an arbitrary number of sections within a voltage amplitude determined by arbitrary reference potentials VOL and VOH. In this manner, evaluation and analysis with high precision of the sloping waveform of the analog signal including a transition state can be achieved. In addition, as AD conversion is performed solely with respect to the sloping rising and falling sections of the waveform of the analog signal, a memory of a large capacity is not required. Moreover, as oscillation circuit 14 is provided inside comparison and determination unit 3, the function test by determination circuit 13 and the sloping waveform test by analysis unit 6 can be conducted in parallel. Therefore, an inexpensive test circuit having a simplified configuration and attaining excellent performance can be obtained.

It is noted that the test circuit may be embedded in the chip of the system LSI (BIST), or provided on the load board of the LSI tester (BOST), for example.

Second Embodiment

Figure 4:
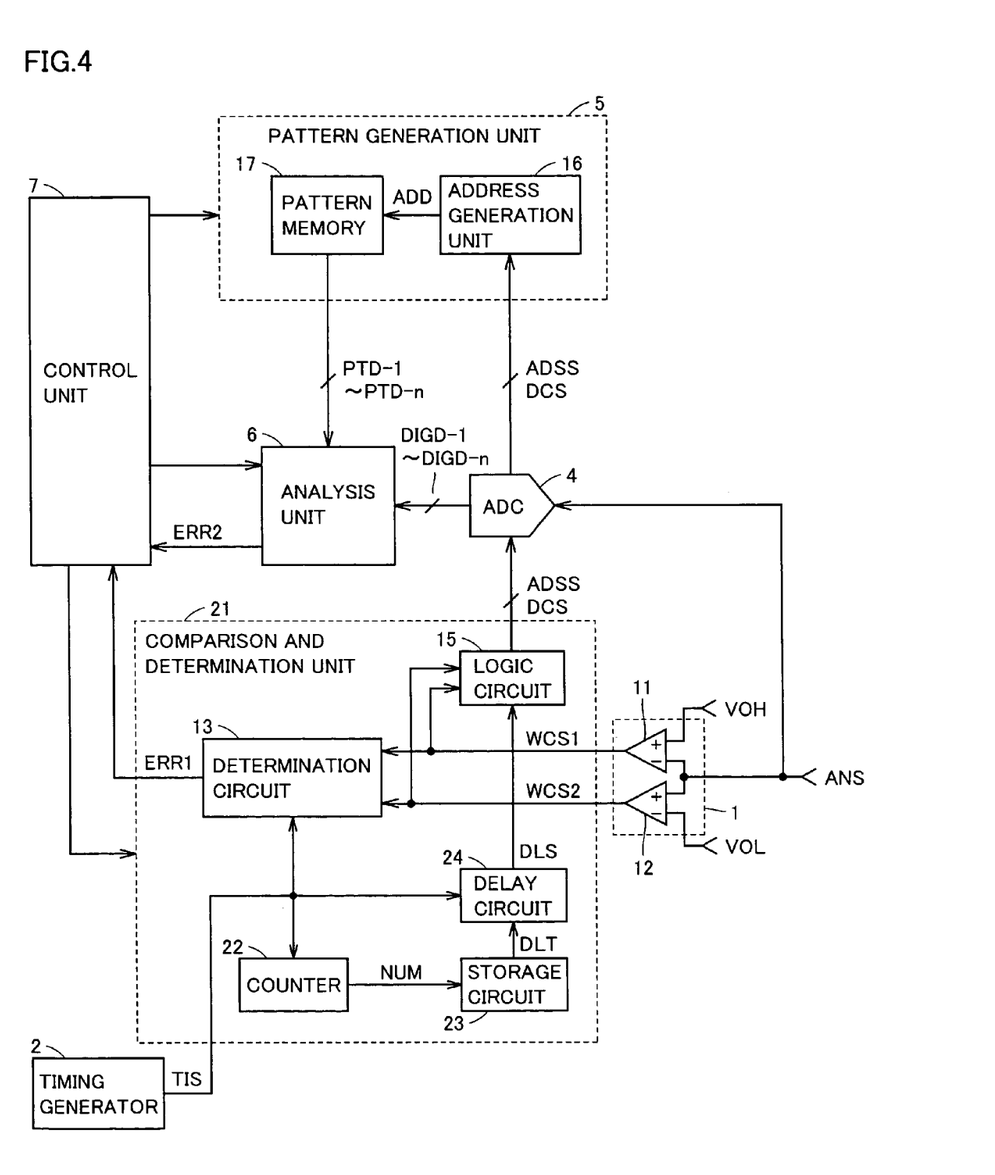
FIG. 4 is a block diagram schematically showing a configuration of a test circuit according to a second embodiment of the present invention.

FIG. 4 is a block diagram schematically showing a configuration of a test circuit according to a second embodiment of the present invention, shown in comparison with FIG. 1. The test circuit in FIG. 4 is different from the test circuit in FIG. 1 in that comparison and determination unit 3 is replaced with a comparison and determination unit 21. Oscillation circuit 14 in comparison and determination unit 3 is replaced with a counter 22, a storage circuit 23, and a delay circuit 24 in comparison and determination unit 21. It is noted that portions in FIG. 4 the same as or corresponding to those in FIG. 1 are given the same reference numerals, and detailed description thereof will not be repeated.

Counter 22 counts a rising edge of the pulse of timing signal TIS from timing generator 2, and outputs the count number as count data NUM(1) to NUM(n−1) (n is an arbitrary natural number). Storage circuit 23 outputs delay data DLT(1) to DLT(n−1) in accordance with count data NUM(1) to NUM(n−1) from counter 22 respectively. Storage circuit 23 stores in advance delay data DLT(1) to DLT(n−1) indicating a delay time corresponding to count data NUM(1) to NUM(n−1) respectively.

Delay circuit 24 receives timing signal TIS from timing generator 2, and outputs a delay signal DLS obtained by delaying timing signal TIS by a delay time instructed by delay data DLT(1) to DLT(n−1) from storage circuit 23.

Figure 5:
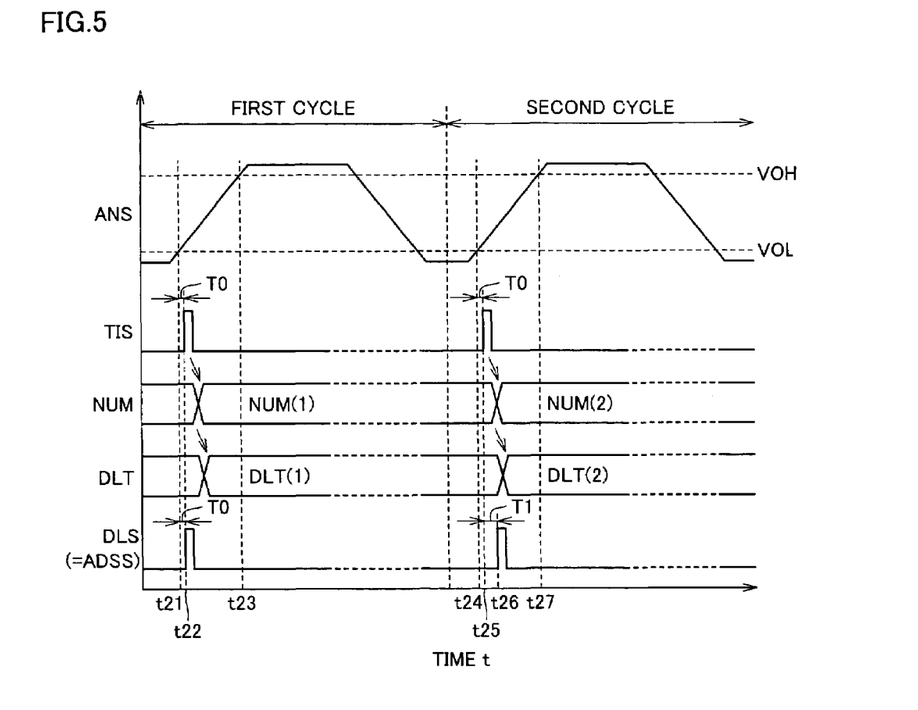
FIG. 5 is a timing chart illustrating an operation of the test circuit shown in FIG. 4.

An operation of the test circuit shown in FIG. 4 will now be described. FIG. 5 is a timing chart illustrating the operation of the test circuit. Referring to FIG. 5, attention is paid to a rising section of the waveform of analog signal ANS of the measurement target device.

The potential of analog signal ANS is raised from "L" level and exceeds reference potential VOL at time t21. At time t23, the potential of analog signal ANS exceeds reference potential VOH. During a period from time t21 to time t23, logic circuit 15 outputs delay signal DLS from delay circuit 24 as AD conversion start signal ADSS.

Timing generator 2 generates timing signal TIS constituted of a pulse signal train having a prescribed cycle. Timing signal TIS rises to "H" level at time t22. An interval between time t21 and time t22 is denoted by T0. Delay circuit 24 outputs timing signal TIS as it is as delay signal DLS, corresponding to a rising section in a first cycle of the waveform of analog signal ANS. That is, delay signal DLS has a pulse raised to "H" level at time t22.

Counter 22 counts the rising edge of timing signal TIS at time t22, and outputs count data NUM(1). Storage circuit 23 outputs delay data DLT(L) indicating a delay time T1 corresponding to count data NUM(1).

Attention is now paid to a rising section in a second cycle of the waveform of analog signal ANS. The potential of analog signal ANS is raised from "L" level and exceeds reference potential VOL at time t24. At time t27, the potential of analog signal ANS exceeds reference potential VOH. During a period from time t24 to time t27, logic circuit 15 outputs delay signal DLS from delay circuit 24 as AD conversion start signal ADSS.

Timing signal TIS rises to "H" level at time t25. An interval between time t24 and time t25 is denoted by T0. Delay circuit 24 outputs as delay signal DLS a signal obtained by delaying timing signal TIS by delay time T1, corresponding to the rising section in the second cycle of the waveform of analog signal ANS. That is, delay signal DLS has a pulse raised to "H" level at time t26, which is delayed by time T1 from time t25.

Counter 22 counts the rising edge of timing signal TIS at time t25, and outputs count data NUM(2). Storage circuit 23 outputs delay data DLT(2) indicating a delay time T2 corresponding to count data NUM(2). Though not shown, a signal obtained by delaying timing signal TIS by delay time T2 is output as delay signal DLS, corresponding to a rising section in a third cycle of the waveform of analog signal ANS.

In this manner, corresponding to the rising sections in the first cycle to (n−1)th cycle of the waveform of analog signal ANS, counter 22 outputs count data NUM(1) to NUM(n−1) respectively. Storage circuit 23 outputs delay data DLT(1) to DLT(n−1) indicating delay times T1 to T(n−1) corresponding to count data NUM(1) to NUM(n−1) respectively. Delay circuit 24 outputs as delay signal DLS signals obtained by delaying timing signal TIS by delay times T1 to T(n−1), corresponding to the rising sections in the second cycle to nth cycle of the waveform of analog signal ANS respectively.

Figure 6:
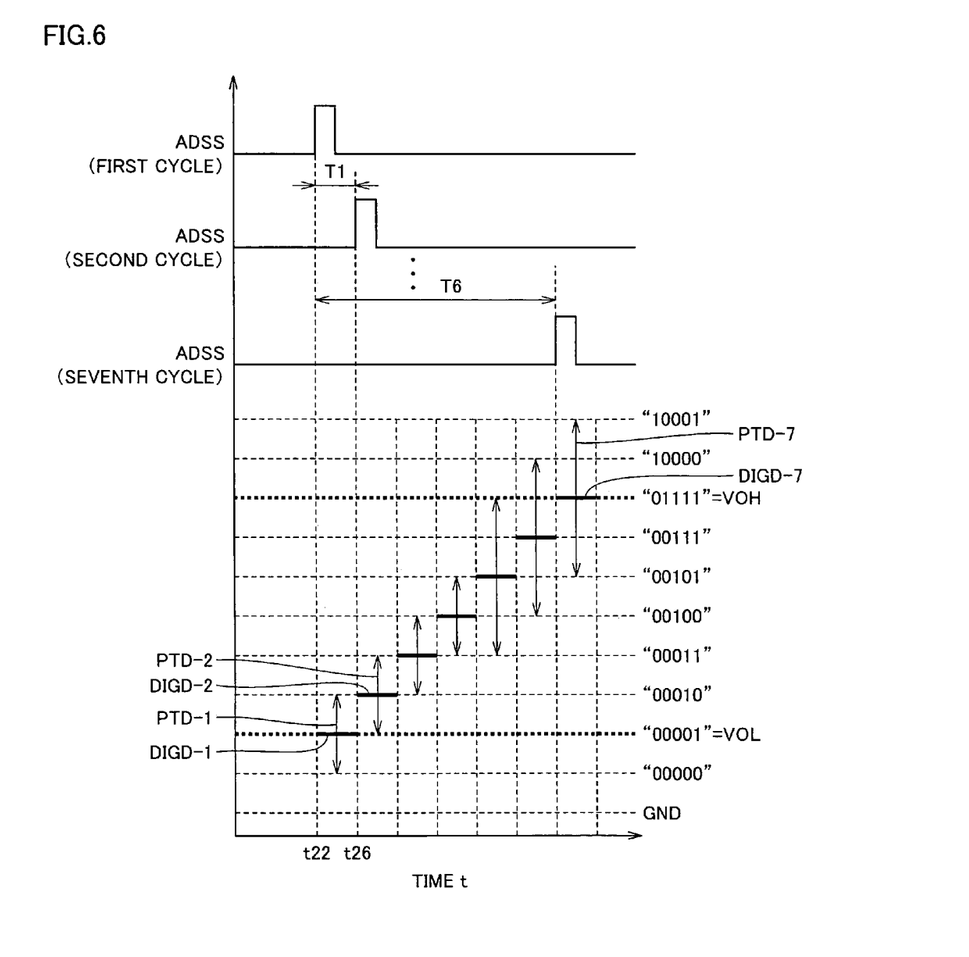
FIG. 6 is a timing chart illustrating the operation of the test circuit in a rising section of a waveform of an analog signal ANS shown in FIG. 5.

FIG. 6 is a timing chart illustrating the operation of the test circuit in the rising section of the waveform of analog signal ANS shown in FIG. 5, shown in comparison with FIG. 3. The timing chart in FIG. 6 is different from the timing chart in FIG. 3 in markings on a time base.

At time t22 shown in FIGS. 5 and 6, ADC 4 generates digital data DIGD-1 ("00001"=reference potential VOL), in response to the pulse of AD conversion start signal ADSS corresponding to the rising section in the first cycle of the waveform of analog signal ANS. In addition, pattern generation unit 5 generates expected value pattern data PTD-1 "00000", "00010"). Analysis unit 6 sets output error signal ERR2 to the inactive level, in response to digital data DIGD-1 ("00001") being within a range determined by expected value pattern data PTD-1 ("00000", "00010").

At time t26 shown in FIGS. 5 and 6, ADC 4 generates digital data DIGD-2 ("00010"), in response to the pulse of AD conversion start signal ADSS corresponding to the rising section in the second cycle of the waveform of analog signal ANS. In addition, pattern generation unit 5 generates expected value pattern data PTD-2 ("00001", "00011"). Analysis unit 6 sets output error signal ERR2 to the inactive level, in response to digital data DIGD-2 ("00010") being within a range determined by expected value pattern data PTD-2 ("00001", "00011").

In this manner, digital data DIGD-1 to DIGD-7 and expected value pattern data PTD-1 to PTD-7 are generated in synchronization with AD conversion start signal ADSS. In addition, analysis unit 6 determines whether or not respective digital data DIGD-1 to DIGD-7 are within a range determined by corresponding expected value pattern data PTD-1 to PTD-7 respectively, and outputs error signal ERR2 in accordance with a result of determination. Analysis unit 6 merges digital data DIGD-1 to DIGD-7 from ADC 4, so as to evaluate and analyze the rising section of the waveform of analog signal ANS, as in the first embodiment.

Though an example in which the voltage range is divided into seven sections ("00001" to "01111") in a range between reference potentials VOL and VOH has been described, AD conversion can be performed in a voltage range divided into an arbitrary number of sections in a range between arbitrary reference potentials VOL and VOH.

Though not shown, an operation is also the same in a falling section of the waveform of analog signal ANS as in the rising section, and a similar effect can be obtained.

Figure 7:
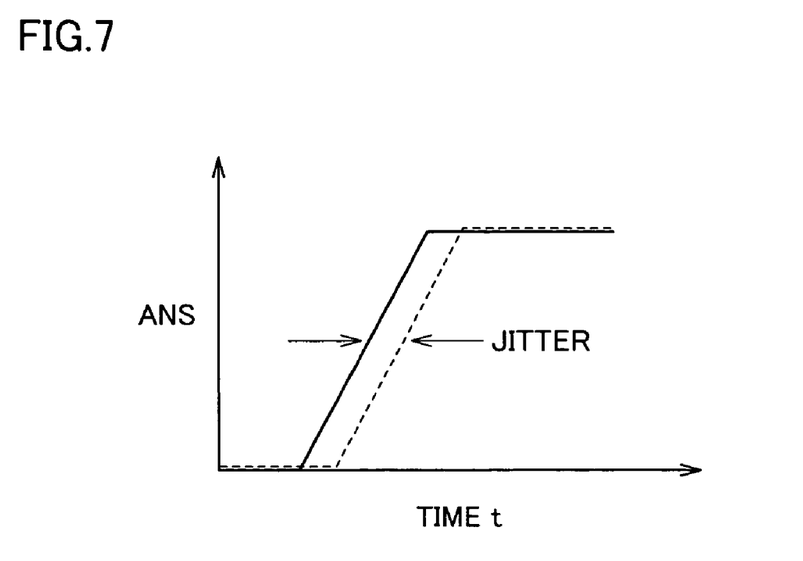
FIG. 7 is a timing chart illustrating a concept of measurement of jitter in analog signal ANS.

Moreover, as AD conversion start signal ADSS is generated based on timing signal TIS from timing generator 2 in the second embodiment, timing of AD conversion by ADC 4 can be reproducible, which enables measurement of jitter in analog signal ANS. FIG. 7 is a timing chart illustrating a concept of measurement of jitter in analog signal ANS. Referring to FIG. 7, when the rising section of the waveform of analog signal ANS is displaced from a waveform shown with a solid line to a waveform shown with a dotted line in reproduction of AD conversion under the same condition, analysis unit 6 analyzes the jitter.

As described above, according to the second embodiment, an inexpensive test circuit having a simplified configuration and attaining excellent performance can be obtained, as in the first embodiment. In addition, the jitter in analog signal ANS can be measured.

Third Embodiment

Figure 8:
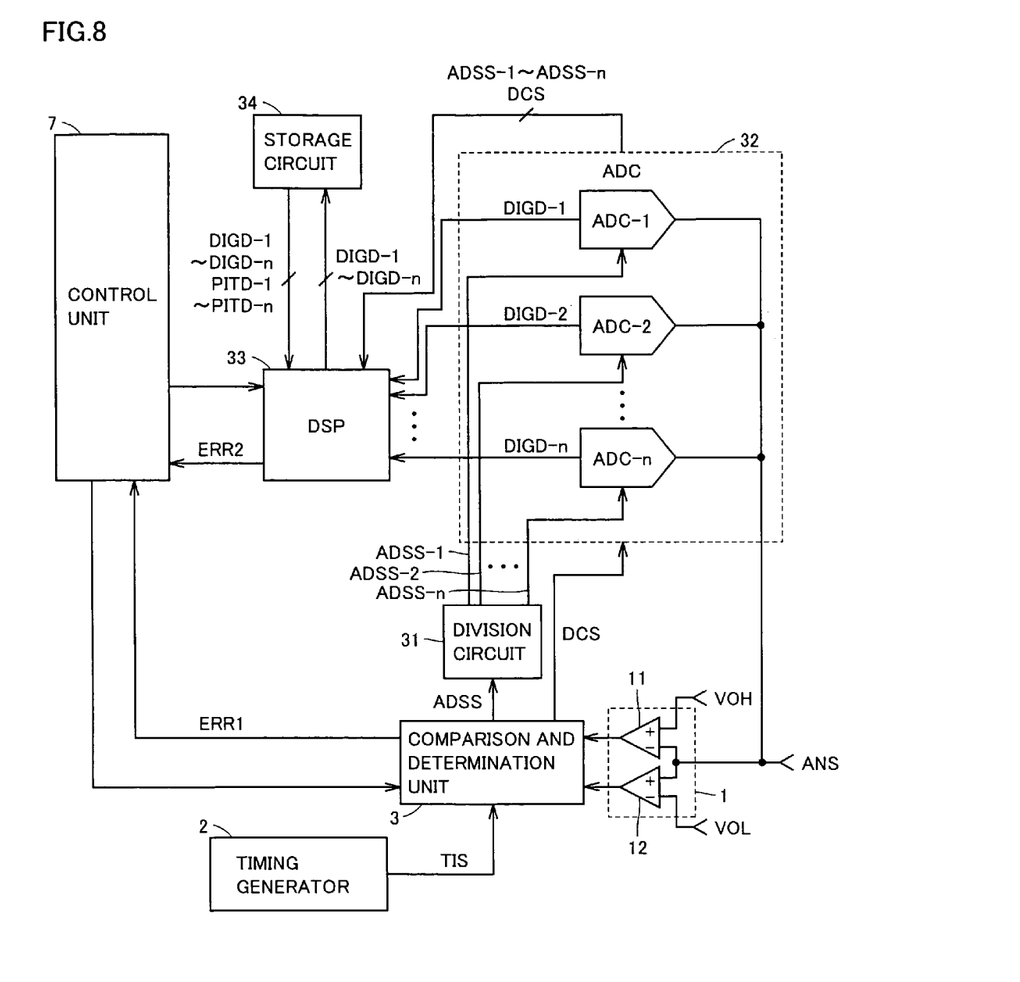
FIG. 8 is a block diagram schematically showing a configuration of a test circuit according to a third embodiment of the present invention.

FIG. 8 is a block diagram schematically showing a configuration of a test circuit according to a third embodiment of the present invention, shown in comparison with FIG. 1. The test circuit in FIG. 8 is different from the test circuit in FIG. 1 in that a division circuit 31 is added, ADC 4 is replaced with an ADC 32, analysis unit 6 is replaced with a DSP (Digital Signal Processor) 33, and pattern generation unit 5 is replaced with a storage circuit 34. It is noted that portions in FIG. 8 the same as or corresponding to those in FIG. 1 are given the same reference numerals, and detailed description thereof will not be repeated.

Figure 9:
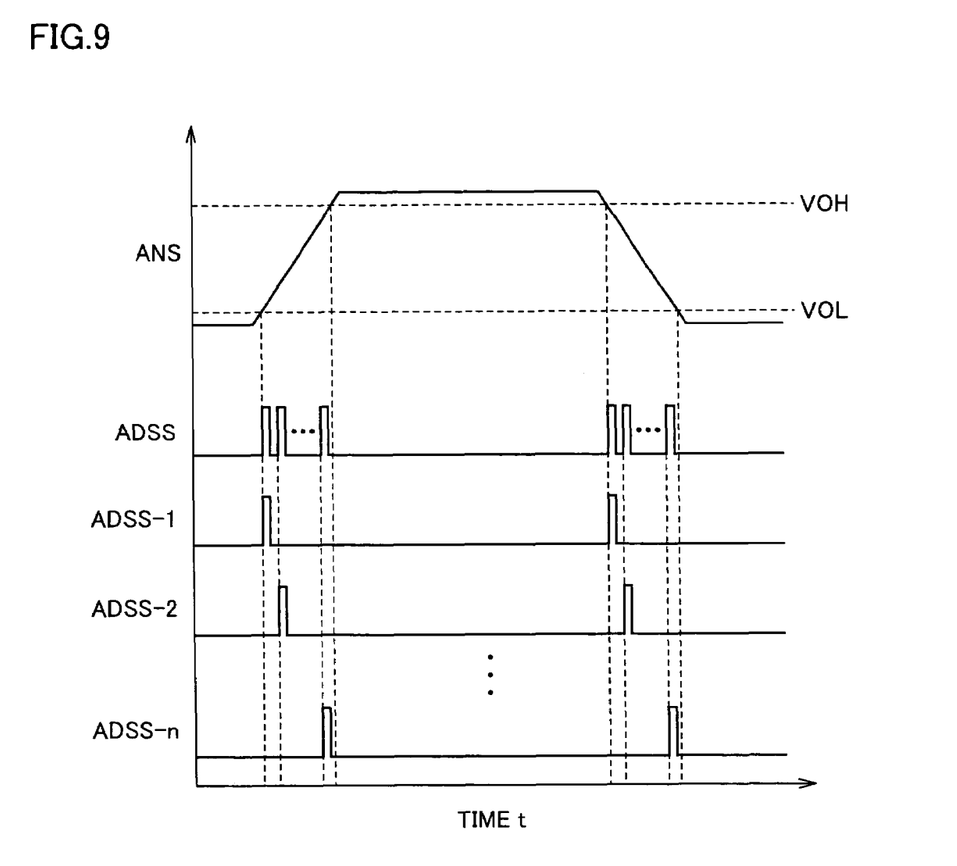
FIG. 9 is a timing chart illustrating an operation of a division circuit shown in FIG. 8.

FIG. 9 is a timing chart illustrating an operation of division circuit 31 shown in FIG. 8. Referring to FIG. 9, division circuit 31 divides AD conversion start signal ADSS from comparison and determination unit 3 into a plurality of AD conversion start signals ADSS-1 to ADSS-n (n is an arbitrary natural number) having different phases respectively, and outputs the divided AD conversion start signals.

AD conversion start signal ADSS-1 has a first pulse of AD conversion start signal ADSS corresponding to the rising section of the waveform of analog signal ANS and a first pulse of AD conversion start signal ADSS corresponding to the falling section of the waveform of analog signal ANS. AD conversion start signal ADSS-2 has a second pulse of AD conversion start signal ADSS corresponding to the rising section of the waveform of analog signal ANS and a second pulse of AD conversion start signal ADSS corresponding to the falling section of the waveform of analog signal ANS. In this manner, AD conversion start signal ADSS-n has a nth pulse of AD conversion start signal ADSS corresponding to the rising section of the waveform of analog signal ANS and a nth pulse of AD conversion start signal ADSS corresponding to the falling section of the waveform of analog signal ANS.

Referring again to FIG. 8, ADC 32 includes n AD conversion circuits ADC-1 to ADC-n. AD conversion circuits ADC-1 to ADC-n subject analog signal ANS to AD conversion based on respective AD conversion start signals ADSS-1 to ADSS-n from division circuit 31 and discrimination signal DCS from comparison and determination unit 3, and generate a plurality of pieces of digital data DIGD-1 to DIGD-n respectively. In addition, AD conversion circuits ADC-1 to ADC-n transmit AD conversion start signals ADSS-1 to ADSS-n from division circuit 31 and discrimination signal DCS from comparison and determination unit 3 to DSP 33. It is noted that an inexpensive and low-speed AD conversion circuit as compared with ADC 4 in FIG. 4 may be employed for AD conversion circuits ADC-1 to ADC-n.

Storage circuit 34 stores in advance a plurality of pieces of expected value pattern data PTD-1 to PTD-n corresponding to the plurality of pieces of digital data DIGD-1 to DIGD-n respectively. In addition, storage circuit 34 attains a function to hold digital data DIGD-1 to DIGD-n from DSP 33, and outputs the stored data in response to DSP 33.

DSP 33 performs a comparison and determination operation based on AD conversion start signals ADSS-1 to ADSS-n and discrimination signal DCS from ADC 32. DSP 33 takes in digital data DIGD-1 to DIGD-n from ADC 32 in accordance with time series, and writes the data in storage circuit 34 as appropriate. DSP 33 capable of high-speed processing as software reads expected value pattern data PTD-1 to PTD-n and digital data DIGD-1 to DIGD-n stored in storage circuit 34 as appropriate, and performs high-speed processing for comparing corresponding pairs of the expected value pattern data and the digital data respectively. In this manner, as DSP 33 carries out time series data analysis of digital data DIGD-1 to DIGD-n, linearity of the slope section of the waveform of analog signal ANS can be determined. In addition, by accumulating data at the same timing point in each cycle, an amount of jitter at an arbitrary timing point can be calculated. As such, data of analog signal ANS at arbitrary timing, such as periodicity in repeating pulses, pulse width, timing between rises (falls) when attention is paid to preceding and subsequent pulses, and relation with a pulse apart by some distance can be analyzed, thereby convenience being improved.

As described above, according to the third embodiment, an inexpensive test circuit having a simplified configuration and attaining excellent performance can be obtained, as in the first embodiment. In addition, further lower cost can be achieved by employing inexpensive AD conversion circuits ADC-1 to ADC-n.

Though not shown, comparison and determination unit 21 shown in FIG. 4 may be employed instead of comparison and determination unit 3. In this case, a similar effect can also be obtained.

Moreover, analysis unit 6 and pattern generation unit 5 shown in FIG. 1 may be employed instead of DSP 33 and storage circuit 34. In this case, lower cost can be achieved by employing inexpensive AD conversion circuits ADC-1 to ADC-n.

Variation of Third Embodiment

Figure 10:
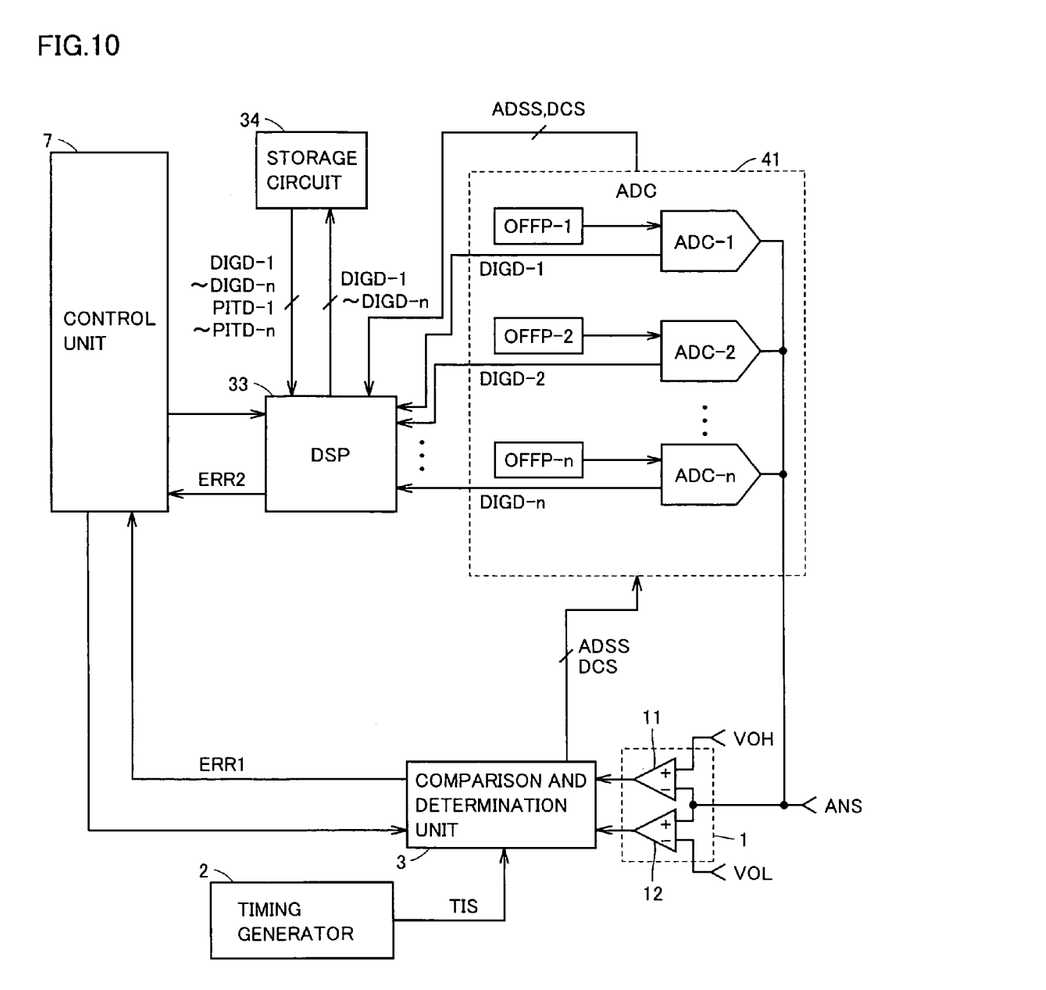
FIG. 10 is a block diagram schematically showing a configuration of a test circuit according to a variation of the third embodiment of the present invention.

FIG. 10 is a block diagram schematically showing a configuration of a test circuit according to a variation of the third embodiment of the present invention, shown in comparison with FIG. 8. The test circuit in FIG. 10 is different from the test circuit in FIG. 8 in that division circuit 31 is removed and ADC 32 is replaced with an ADC 41. It is noted that portions in FIG. 10 the same as or corresponding to those in FIG. 8 are given the same reference numerals, and detailed description thereof will not be repeated.

ADC 41 includes n AD conversion circuits ADC-1 to ADC-n and offset power supplies OFFP-1 to OFFP-n. Offset power supplies OFFP-1 to OFFP-n apply different offset power supply voltages to corresponding AD conversion circuits ADC-1 to ADC-n respectively. AD conversion circuits ADC-1 to ADC-n perform AD conversion in a voltage range determined by the offset power supply voltage of corresponding offset power supplies OFFP-1 to OFFP-n respectively. AD conversion circuits ADC-1 to ADC-n subject analog signal ANS to AD conversion based on AD conversion start signal ADSS and discrimination signal DCS from comparison and determination unit 3, and generate a plurality of pieces of digital data DIGD-1 to DIGD-n respectively. In addition, AD conversion circuits ADC-1 to ADC-n transmit AD conversion start signal ADSS and falling discrimination signal DCS from comparison and determination unit 3 to DSP 33.

Figure 11:
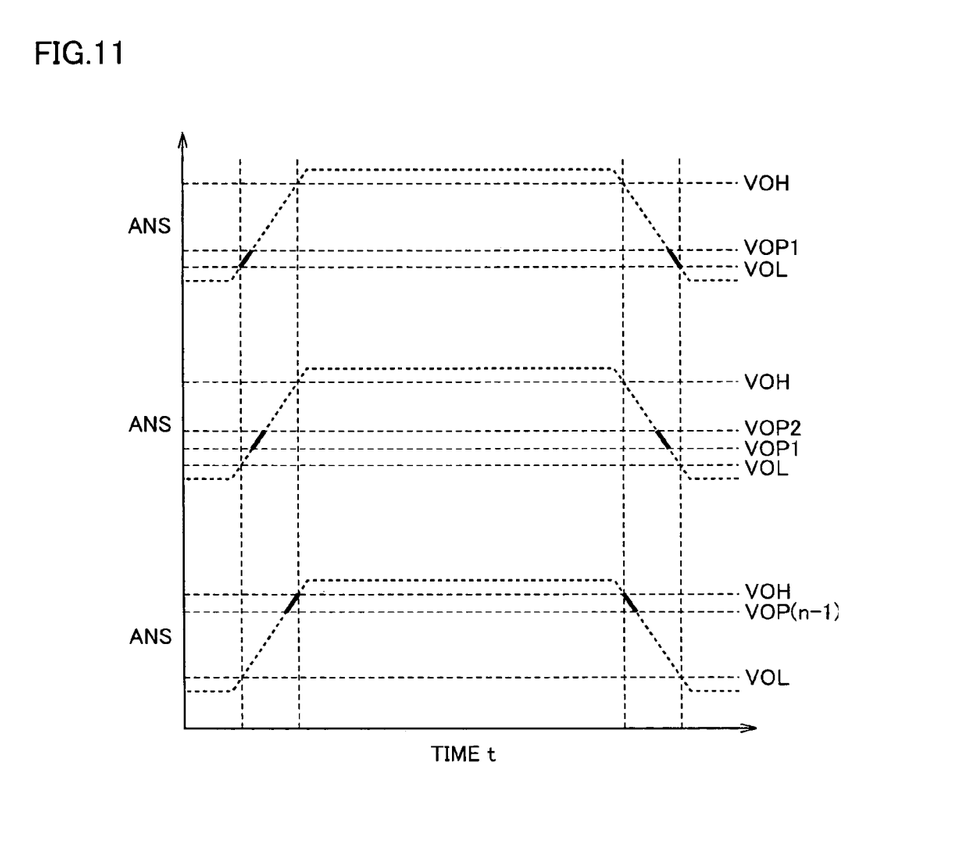
FIG. 11 is a timing chart illustrating an operation of AD conversion circuits ADC-1 to ADC-n and offset power supplies OFFP-1 to OFFP-n shown in FIG. 10.

FIG. 11 is a timing chart illustrating an operation of AD conversion circuits ADC-1 to ADC-n and offset power supplies OFFP-1 to OFFP-n shown in FIG. 10. Referring to FIGS. 10 and 11, AD conversion circuit ADC-1 subjects analog signal ANS to AD conversion in a voltage range (VOL to VOP1) determined by the offset power supply voltage from offset power supply OFFP-1, and generates digital data DIGD-1. AD conversion circuit ADC-2 subjects analog signal ANS to AD conversion in a voltage range (VOP1 to VOP2) determined by the offset power supply voltage from offset power supply OFFP-2, and generates digital data DIGD-2. Similarly, AD conversion circuit ADC-n subjects analog signal ANS to AD conversion in a voltage range (VOP(n−1) to VOH) determined by the offset power supply voltage from offset power supply OFFP-n, and generates digital data DIGD-n. In this manner, the voltage range is divided into n−1 sections in a range between arbitrary reference potentials VOL and VOH.

Therefore, according to the variation of the third embodiment, even if a voltage amplitude of analog signal ANS output from the measurement target device is large, evaluation and analysis with high precision can be achieved by dividing the voltage range into an arbitrary number of sections using the offset power supply.

Though not shown, comparison and determination unit 21 shown in FIG. 4 may be employed instead of comparison and determination unit 3. In this case, a similar effect can also be obtained.

Moreover, analysis unit 6 and pattern generation unit 5 shown in FIG. 1 may be employed instead of DSP 33 and storage circuit 34. In this case, a similar effect can also be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A test circuit for evaluating a characteristic of an analog signal of a device, comprising:
   a comparator outputting a first signal when a potential of an analog signal of said device is within a predetermined range and outputting a second signal when the potential of the analog signal of said device is out of the predetermined range;

a timing generator generating a timing signal constituted of a pulse signal train;

a determination circuit operating in synchronization with said timing signal and determining whether an output signal of said comparator matches with predetermined expected value data;

a clock generation circuit generating a clock signal;

a logic circuit receiving the output signal of said comparator, passing and outputting the clock signal from said clock generation circuit in response to said first signal, and blocking the clock signal from said clock generation circuit in response to said second signal;

an analog-digital converter operating in synchronization with an output signal of said logic circuit, converting the analog signal of said device to digital data, and outputting resultant digital data; and an analysis unit analyzing the digital data from said analog-digital converter; wherein said determination circuit conducts a function test to determine whether timing of a slope section of a waveform of said analog signal is within a predetermined range, and said analysis unit conducts a sloping waveform test to evaluate a sloping state of the waveform of said analog signal.

2. The test circuit according to claim 1, wherein said analysis unit includes a pattern generation unit generating expected value pattern data corresponding to the digital data output from said analog-digital converter to said analysis unit, and a sub analysis unit determining whether said digital data is within a range determined by said expected value pattern data.

3. The test circuit according to claim 2, wherein said pattern generation unit includes a storage circuit storing said digital data and said expected value pattern data, and said sub analysis unit includes a processing unit carrying out writing and reading of data in said storage circuit.

4. The test circuit according to claim 1, wherein said clock generation circuit includes an oscillation circuit generating said clock signal constituted of a pulse signal train of a prescribed cycle.

5. The test circuit according to claim 1, wherein said clock generation circuit includes a counter counting number of pulses in the timing signal from said timing generator and outputting the counted number, and a delay circuit determining a delay time in accordance with the number of pulses counted by said counter and outputting a signal obtained by delaying said timing signal by the determined delay time as said clock signal.

6. The test circuit according to claim 1, further comprising a division circuit dividing the clock signal from said logic circuit into a plurality of clock signals having different phases respectively, and outputting resultant divided clock signals, wherein said analog-digital converter includes a plurality of analog-digital conversion circuits provided corresponding to the plurality of said clock signals respectively, operating in synchronization with corresponding said plurality of clock signals respectively, converting the analog signal of said device to digital data, and outputting resultant digital data.

7. The test circuit according to claim 1, wherein said analog-digital converter includes a plurality of offset power supplies having different offset power supply voltages respectively, and a plurality of analog-digital conversion circuits provided corresponding to the plurality of said offset power supplies respectively, converting the analog signal of said device to digital data in a voltage range determined by the offset power supply voltage of corresponding said plurality of offset power supplies respectively, and outputting resultant digital data.

8. The test circuit according to claim 1, wherein said test circuit is embedded in a chip of said device.

9. The test circuit according to claim 1, wherein said test circuit is provided in a tester outside said device.

* * * * *